Figure 1:
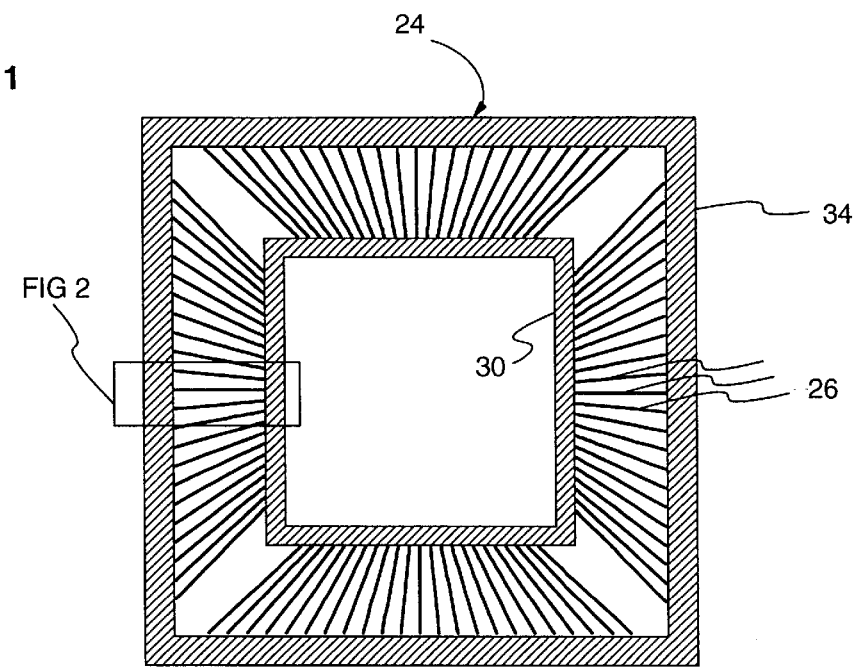

United States Patent
Alcoe et al.

[11] Patent Number: 6,060,341
[45] Date of Patent: May 9, 2000

[54] METHOD OF MAKING AN ELECTRONIC PACKAGE

[75] Inventors: David James Alcoe, Vestal; Frank Edward Andros, Binghamton, both of N.Y.

[73] Assignee: International Business Machines Corporation, Armonk, N.Y.

[21] Appl. No.: 09/005,538

[22] Filed: Jan. 12, 1998

[51] Int. Cl.[7] .................................................. H01L 21/44
[52] U.S. Cl. ............................ 438/123; 438/111; 438/112
[58] Field of Search ..................................... 257/673, 674, 257/676, 692, 779; 438/111, 123, 611, 112, 124, FOR 369, FOR 377, FOR 380

[56] References Cited

U.S. PATENT DOCUMENTS

| | | | |
|---|---|---|---|
| 4,000,842 | 1/1977 | Burns | 228/180 A |
| 4,005,472 | 1/1977 | Harris et al. | 257/762 |
| 4,380,042 | 4/1983 | Angelucci, Sr. et al. | 361/421 |
| 4,849,856 | 7/1989 | Funari et al. | 361/386 |
| 4,873,123 | 10/1989 | Canestaro et al. | 427/96 |
| 4,899,207 | 2/1990 | Hallowell et al. | 257/671 |
| 4,914,551 | 4/1990 | Anschel et al. | 361/389 |
| 4,979,663 | 12/1990 | Sofia et al. | 228/180.2 |
| 5,029,386 | 7/1991 | Chao et al. | 29/827 |
| 5,034,591 | 7/1991 | Fang | 219/121.69 |
| 5,098,008 | 3/1992 | Viza et al. | 228/180.2 |
| 5,099,393 | 3/1992 | Bentlage et al. | 361/413 |
| 5,278,724 | 1/1994 | Angulas et al. | 361/707 |
| 5,336,564 | 8/1994 | Moldavsky | 428/418 |
| 5,386,341 | 1/1995 | Olson et al. | 361/749 |
| 5,397,921 | 3/1995 | Karnezos | 257/779 |
| 5,435,732 | 7/1995 | Angulas et al. | 439/67 |
| 5,770,480 | 6/1998 | Ma et al. | 438/123 |

FOREIGN PATENT DOCUMENTS 2-106943  4/1990  Japan .

OTHER PUBLICATIONS

IBM Technical Disclosure Bulletin, vol. 30, No. 4, Sep. 1987, pp. 1511–1512, "Aid for Electronic Package Lead Alignment".

*Primary Examiner*—Donald L. Monin, Jr.
*Assistant Examiner*—Alonzo Chambliss
*Attorney, Agent, or Firm*—John R. Pivnichny

[57] ABSTRACT

An electronic package is made by electrically bonding groups of conductive leads to two circuitized members after aligning the leads with electrical conductors on the circuitized members. Retention members may be used to hold the leads in alignment relative to each other prior to bonding and then are removed. Removal may include tearing away the retention member in propinquity to notches in the leads.

18 Claims, 5 Drawing Sheets

METHOD OF MAKING AN ELECTRONIC PACKAGE

TECHNICAL FIELD

This invention relates to electronic packages and particularly those which utilize semiconductor devices (chips) electrically connected to a circuitized substrate using thermocompression bonds. Such packages may be used in such products as information handling systems (computers).

BACKGROUND OF THE INVENTION

Electronic packages of the variety described above are known in the art. Examples are defined in detail in U.S. Pat. Nos. 5,435,732 (Angulas et al), 5,397,921 (Karnezos), 5,386,341 (Olson et al), 5,278,724 (Angulas et al), 4,873,123 (Canestaro et al), 4,000,842 (Burns), 4,005,472 (Harris et al) and 4,899,207 (Hallowell et al). Methods for forming electronic packages of the variety described above are defined in U.S. Pat. Nos. 5,029,386 (Cha et al), 5,336,564 (Moldavsky), 5,034,591 (Fang), 4,979,663 (Sofia et al), 5,098,008 (Visa et al), and IBM Technical Disclosure Bulletin Vol. 30, No. 4, pp. 1511–1512, September, 1987.

As defined therein, such packages may include a chip electrically coupled to one side of a flexible circuit member which is typically of a dielectric, e.g., polyimide, having at least one layer of circuitry, e.g., copper. Such a chip may be coupled, electrically, to the flexible circuit member's circuitry using solder. See, e.g., U.S. Pat. No. 5,435,732 at FIG. 10. A well-known technique for accomplishing such a solder coupling includes what is known in the industry as a controlled collapse chip connection ("C4") procedure. Another known process is a thermal compression bonding ("TCB") procedure. Because both processes are known, further description is not believed necessary. The flexible circuitry ("tape") may then be coupled electrically to respective circuitry, e.g., copper pads or lines, formed on the surfaces of another flex circuit, a more rigid printed circuit board, a ceramic substrate, or the like. Circuit boards, usually comprised of several layers of dielectric material, e.g., fiberglass-reinforced epoxy resin, interspersed with various conductor levels, e.g., power, signal and/or ground planes, and often including plated through holes and/or internal conductive vias are known in the art and further definition is not believed necessary.

Because of the disparate nature of chip manufacturing methods from circuitized substrate methods (such as methods of producing printed circuit boards of flexible tape substrates), it is necessary to prepare a chip and substrate independently and subsequently join these elements electrically. The art of forming such a connection in the face of significant manufacturing constraints encompasses problems such as dimensional tolerancing, material selection, bonding methods, and mechanical reliability of the resulting bonds. It is known that chip sizes continue to shrink, yet the number of signals (electrical connections each requiring a separate bond) continue to grow as the art of chip manufacturing advances. Therefore, a method of bonding many electrical signal paths in a small, dense area from the chip to a circuitized substrate is of great utility in the field of electronic packaging. A method which can be used to form mechanically strong connections is desired for robustness and reliability, and a method which allows for increased manufacturing yield is also of great interest for economic reasons.

It is believed that an electronic package assembly capable of overcoming the several aformentioned problems, and a method of making same, would consitute significant advancements in the art.

The invention as taught herein allows the use of an electrically conductive member as a medium for an interim circuit path between a chip and a circuitized substrate, with a simple means of forming the member into hundreds or thousands of separate, robust electrically conductive paths. The use of a member separate from either the chip or substrate allows for several significant advantages. First, the material chosen for the member can be a material which will optimally bond to both the chip and the substrate, with appropriate surface finish for each bond. Second, the separate member need not be subjected to any of the required processing steps of the chip and/or substrate, avoiding damage and yield loss. Finally, manufacturing methods specific to forming the delicate, precise shapes for the separate member are possible and these methods need not be applied to either the chip or substrate.

Another significant feature of the invention is the use of tear-off notches to remove retention members after bonding. Because these are removed after bonding, the retention members serve to dimensionally control the location of the numerous signal lines throughout the bonding process, assuring that the signal lines will be aligned with the desired bonding locations. Locating the retention members fairly close to the bonding locations of the signal lines maximizes their effect. Locating the notches outside the signal line region of interest (the conductive path between the chip and substrate) so that signal line electrical impedance is not altered is an important advantage of the invention. Further, the ability to use retention members which are of the same material as the signal lines is an advantage. The use of the same material assures simple dimensional control as temperature changes are applied (e.g., as during thermocompression bonding) and enables simple photoetching and plating manufacture using known methods. Still further, because the retention members are totally removed after bonding, there is no need to be concerned with the specific electrical (dielectric or not) or mechanical properties thereof; only the numerous signal lines between the chip and substrate which remain are of interest to the completed electronic package.

OBJECTS AND SUMMARY OF THE INVENTION

It is, therefore, a primary object of the present invention to enhance the art of electronic packages and particularly those packages for use in the computer industry.

It is another object of the invention to provide an electronic package which overcomes the aforementioned disadvantages of various known packages.

It is a still further object of the invention to provide an electronic package which can be produced in a relatively inexpensive manner, and which is adaptable to mass production techniques for such packages.

In accordance with one aspect of the invention, there is defined a method of making an electronic package which comprises the steps of positioning a first circuitized member having a plurality of electronic conductors, positioning a second circuitized member having a plurality of electrical conductors, positioning an electrically conductive member including a plurality of conductive leads as part thereof such that selected ones of conductive leads are aligned with respective pairs of electrical conductors of first and second circuitized members, and substantially simultaneously electrically bonding conductive leads to respective pairs of electrical conductors.

In accordance with another aspect of the invention, there is provided a method of making an electronic package which comprises the steps of forming an electrically conductive member including a plurality of conductive leads as part thereof with selected ones of the plurality of conductive leads secured to spaced apart first and second electrically conductive retention members as part thereof, the first and second electrically conductive retention members retaining selected ones of a plurality of conductive leads in alignment relative to one another, positioning a first circuitized member having a plurality of electrical conductors, positioning a second circuitized member having a plurality of electrical conductors, positioning an electrically conductive member relative to first and second circuitized members such that selected ones of conductive leads are aligned with respective pairs of electrical conductors of first and second circuitized members, electrically bonding a first group of selected ones of a plurality of conductive leads to selected ones of a plurality of electrical conductors of a first circuitized member, and thereafter electrically bonding a second group of selected ones of a plurality of conductive leads to selected ones of a plurality of electrical conductors of a second circuitized member.

BRIEF DESCRIPTIONS OF THE DRAWINGS

Figure 2:
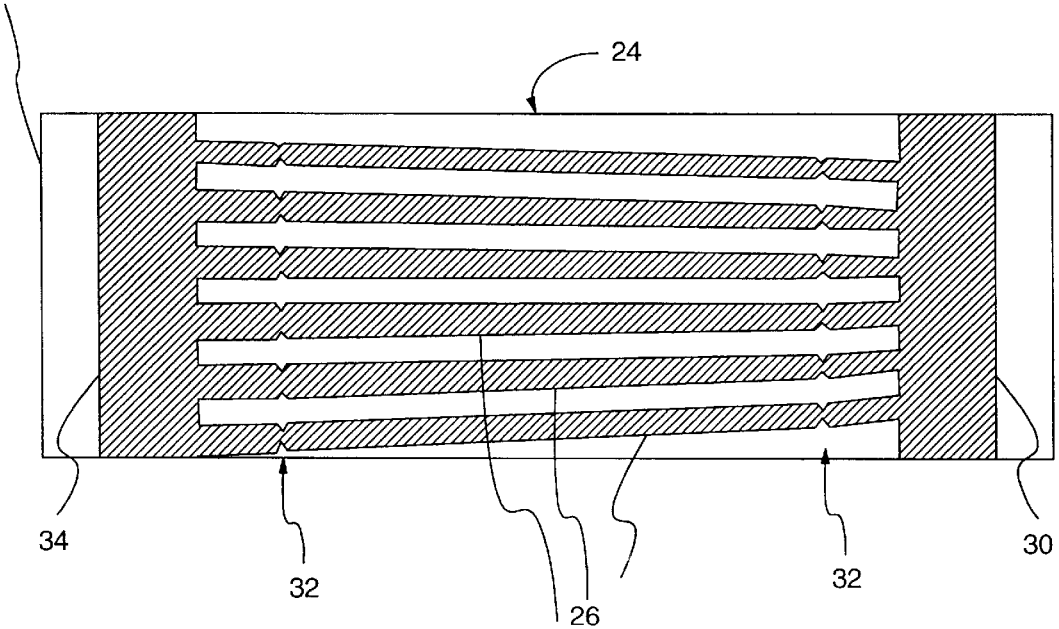
Figure 3:
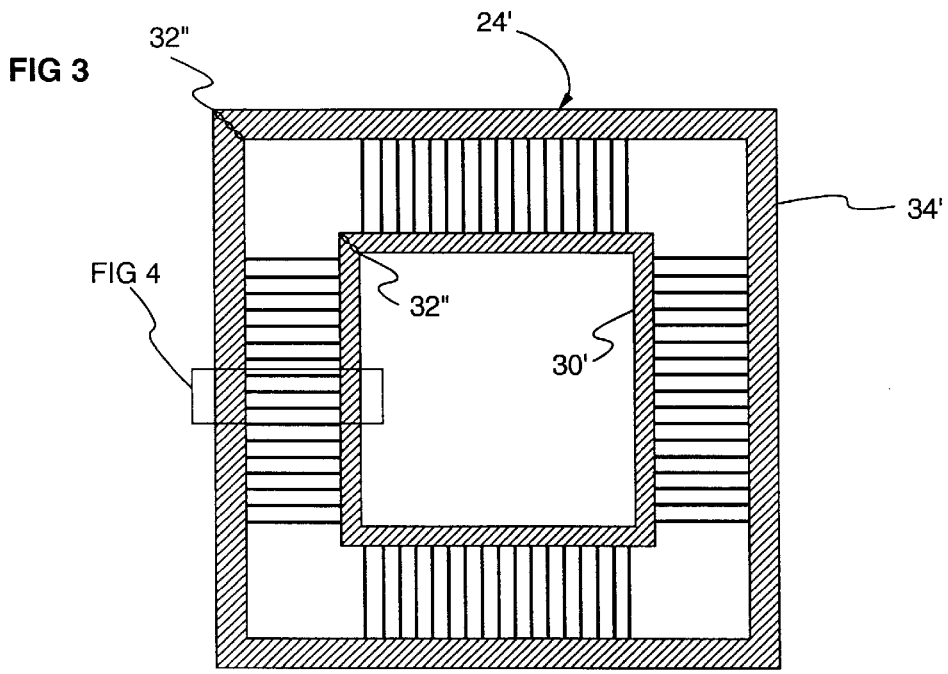
Figure 4:
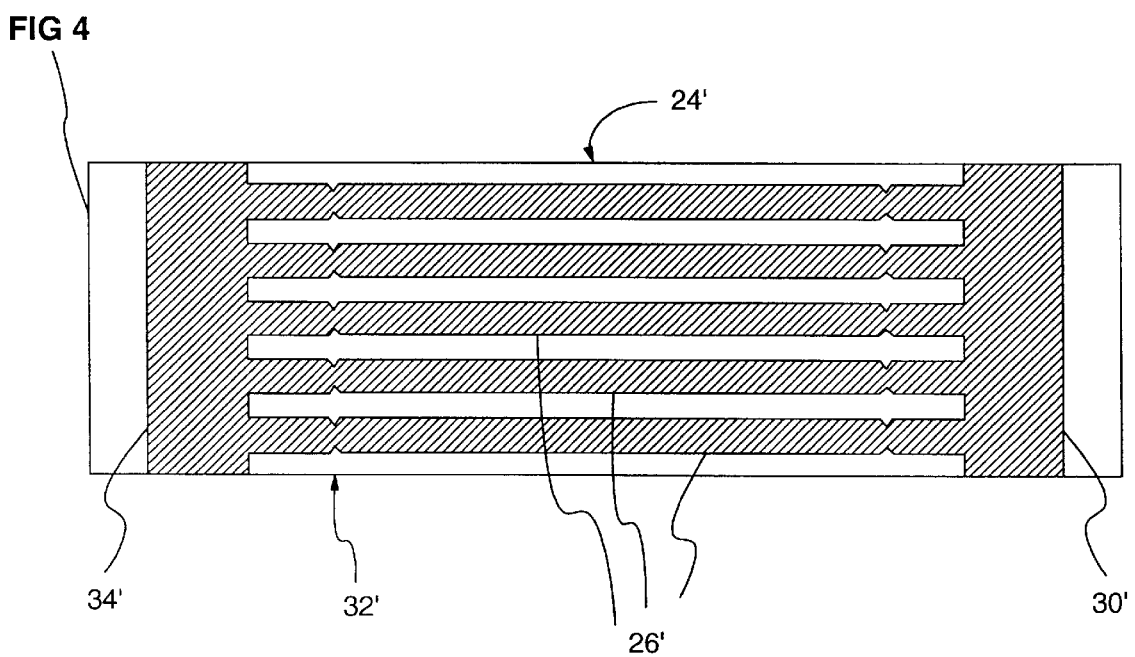
Figure 5:
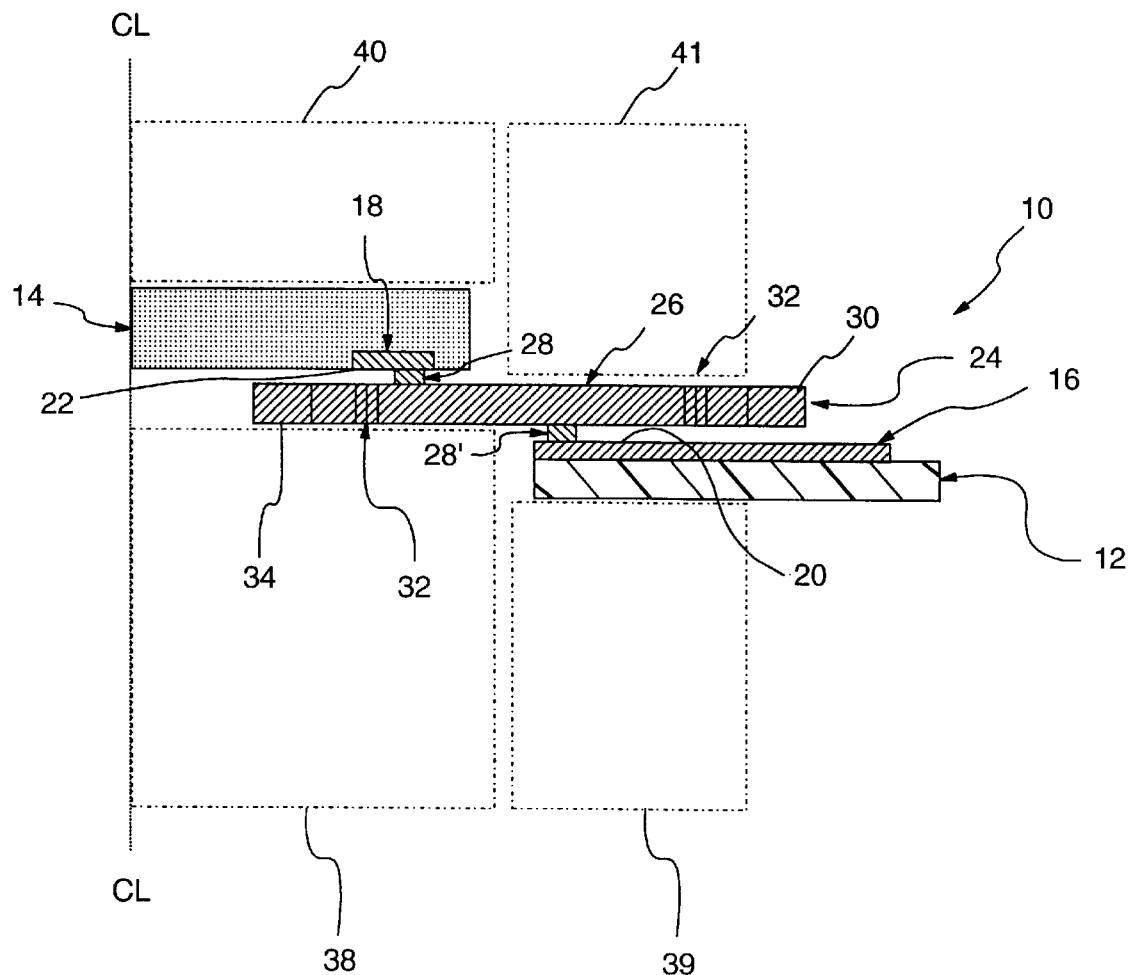
Figure 6:
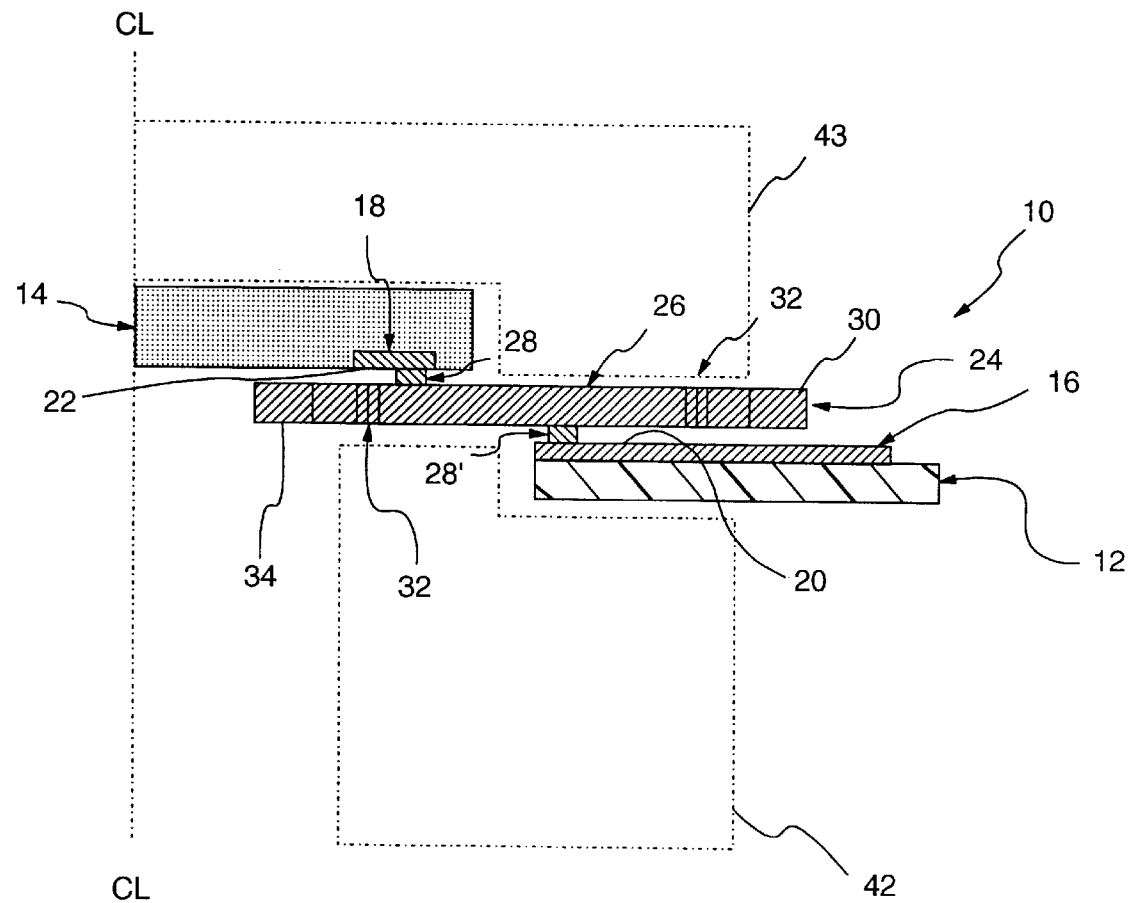
Figure 7:
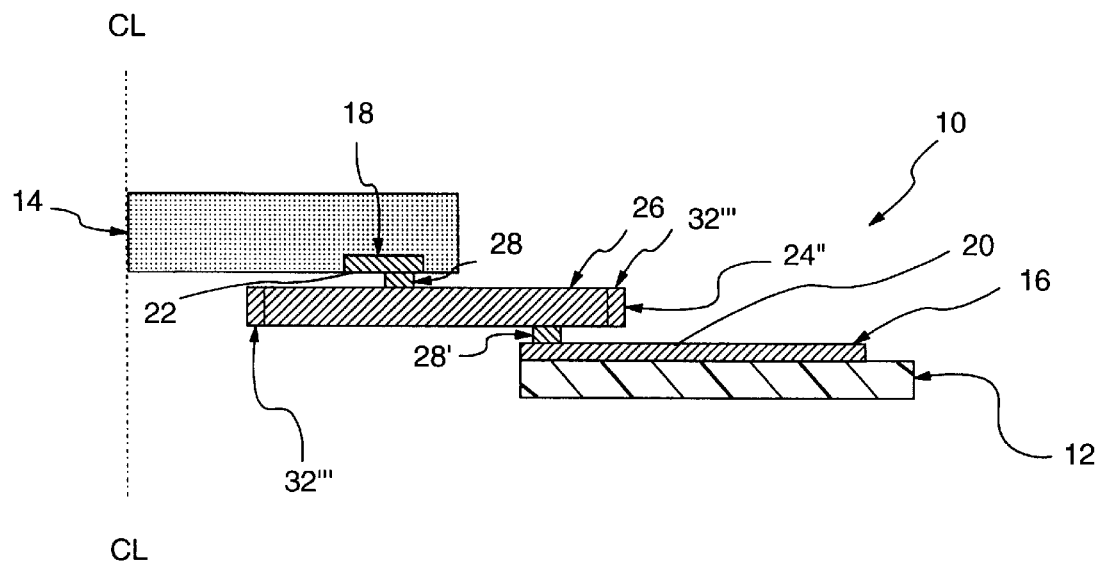
Figure 8:
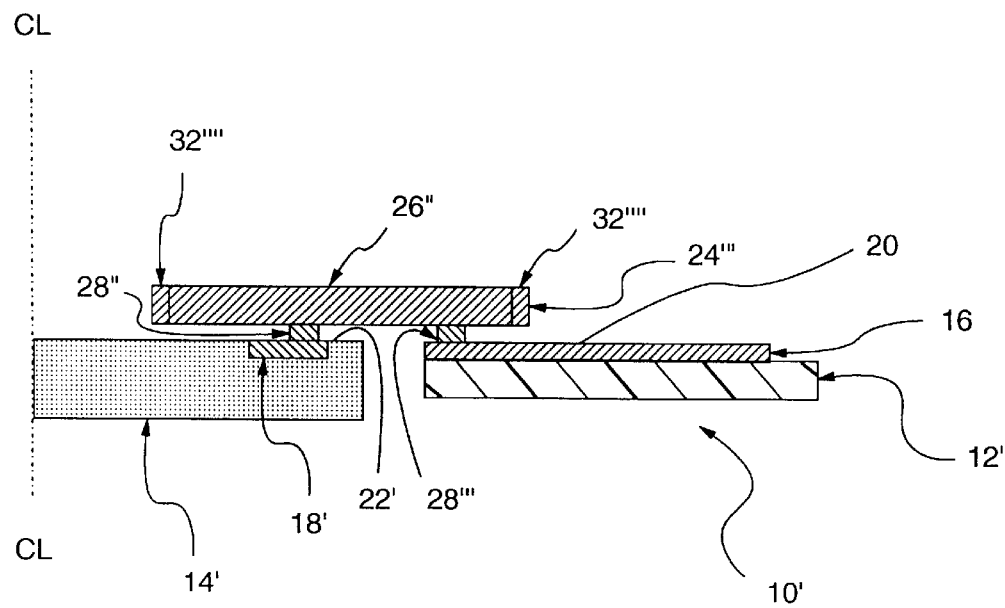

FIG. 1 is a partial plan, sectional view, in elevation and on a much enlarged scale, of an electrically conductive member in accordance with one embodiment of the invention. The partial views provided herein, all on an enlarged scale, are shown herein in such a manner for ease of illustration;

FIG. 2 is an enlarged view of a portion of the electrically conductive member illustrated in FIG. 1. A plurality of conductive leads are illustrated secured to a first retention member; a second retention member is illustrated spaced apart from first retention member. Notches are depicted on selected ones of conductive leads of the electrically conductive member;

FIG. 3 is a partial plan, sectional view, in elevation and on a much enlarged scale, of an electrically conductive member in accordance with another embodiment of the invention;

FIG. 4 is an enlarged view of a portion of the electrically conductive member illustrated in FIG. 3. A plurality of conductive leads are illustrated secured to a first retention member; a second retention member is illustrated spaced apart from first retention member. Notches are depicted on selected ones of conductive leads of the electrically conductive member;

FIG. 5 is a partial side, sectional view of an electronic package in accordance with one embodiment of the invention. It is understood that the center line CL—CL in the drawing figures indicates a mirror image of the illustrated section to the left of the line. Two pairs of bonding heads are depicted in phantom. First and second retention members are depicted secured to conductive leads;

FIG. 6 is a partial side, sectional view of an electronic package in accordance with another embodiment of the invention. One pair of bonding heads are depicted in phantom;

FIG. 7 is a partial side, sectional view of an electronic package in accordance with another embodiment of the invention. First and second retention members have been removed by material separation in substantially adjacent notches in conductive leads of the conductive member. First and second circuitized members are depicted with respective first surfaces in a facing relationship with the second circuitized member; and FIG. 8 is a partial side, sectional view of an electronic package in accordance with yet another embodiment of the invention. First and second retention members have been removed by material separation in substantially adjacent notches in conductive leads of the conductive member. The conductive member is depicted located above the second circuitized member.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

In FIG. 1, there is shown an electrically conductive member 24, with an enlarged portion thereof shown in more detail in FIG. 2. In this embodiment, the member 24 is depicted as a rectangular (e.g., square) ring of a plurality of conductive leads 26, including first retention member 30 and second retention member 34. Also visible in FIG. 2 are notches 32 in selected ones of conductive leads 26. Typical dimensions for the width of an individual conductive lead 26 can vary from as little as 0.0005 inch to 0.010 inch, with a thickness (out of plane of FIG. 1 and FIG. 2) of 0.0002 to 0.004 inch, spanning a distance from first retention member 30 to second member 34 of 0.008 to 0.050 inch. One electrically conductive member may include from about 40 to as many as several thousand conductive leads 26, depending on the overall size of the member. In the art of forming electrical connections between a complex silicon device (commonly known as a chip) or other circuitized member 14 and another circuitized member 12 (see below), it is advantageous to be able to form many circuits so as to enable more complex and useful devices. It is also advantageous to form these circuits in a small, dense region so that a smaller device may be utilized. These fundamental desires drive the use of very small, fine, delicate conductive leads 26 in order to geometrically satisfy the size constraints of forming many conductors 26 in a small space. A typical application utilizing about 800 conductive leads can have leads of width 0.002 inch, spaced on a 0.004 inch pitch, and enable connecting a chip of size 21 millimeters (mm) square with a perimeter of electrical conductors 18 to a circuitized substrate 12. Materials suitable for the conductive member 24 include copper, aluminum, gold and also plated versions of copper with nickel-gold plating. A key advantage of the invention is that the selection of materials most suitable for bonding to each of the respective circuitized members 12 and 14 is not limited to, for example, the material of electrical conductors 16 as part of circuitized substrate 12. For example, gold and aluminum are known to readily bond to many other metals using known methods of thermocompression bonding.

Therefore, although nickel plated copper may be the material of choice for circuitized member 12, it may not be readily and reliably joined to the material chosen for electrical conductors 18 of circuitized member 14. The use of a better bonding material such as aluminum as an interim conducting and bonding medium, i.e. member 24, can therefore be optimally selected by use of the invention.

Another key aspect of the invention is that the plurality of electrical conductors 26 as part of the conductive member 24, need not be subjected to the many involved processing steps which first and second circuitized members 12 and 14 must be subjected to in the course of manufacture. These steps include cleaning, handling, etching, heating, washing, electroplating, inspecting, testing, and many other known operations unique to each of the respective members. Because of the separate nature of the conductive member 24, the fine, delicate electrical conductors may be kept safe, intact, undamaged, clean, aligned and dimensionally optimal for the subsequent step of electrically bonding and thereby connecting the first and second circuitized members 24. Because of this, very fine pitches of very fine leads 26 can reliably be manufactured and bonded to circuitized members.

One of the operations typically used for manufacture of the conductive member is to photoetch a desired pattern onto a sacrificial substrate (not shown); the member 24 is then electroplated and the substrate is etched away, leaving the conductive member 24 shown in FIG. 1. As part of the design, notches 32 are easily incorporated into predetermined positions on the plurality of conductive leads 26 of member 24. The purpose of the notches is to allow the retention member 30 and 34 to be easily removed after the bonding operation, not before. If one of the retention members were to be removed before bonding, e.g., with a cutting operation as is known in the art, the plurality of conductive leads 26 would be minimally supported at one end in a 'cantilever' fashion and subject to being easily misaligned and damaged beyond use or repair. Further, the act of removing (excising) a retention member may itself alter the positions of the conductive leads 26 or damage these by bending or twisting. Clearly, it is advantageous to maintain both retention members 34 and 30 prior to bonding so that the dimensional integrity of the leads 26 is assured. Removal of the members after bonding is therefore facilitated by use of notches 32; the reduced cross sectional area in the region of notches 32 on each conductive lead reduces the strength of the lead to less than that of the electrical bonds. The retention member is simply torn off after bonding, with the material to the lead separating at or near the notches due to the locally increased stress there. The particular shape of the notches is not critical, but must result in sufficient reduction of lead strength so that the mechanical strength of electrical bonds 28 is not exceeded and the bond is not damaged by the removal of members 30 and 34. A reduction of cross sectional area from 0.002×0.001 inches nominal (no notch) to 0.001×0.001 inches in the notch region has been found to be sufficient for use with simple rectangular copper leads which are then thermocompression bonded (e.g., to a chip). It is important to note that this operation results in a 100% stress test to assure electrical bonds of a minimal strength thereby avoiding a costly further sampling operation to destructively test for adequate bond strength as is typically required in today's manufacturing processes.

In FIG. 3 another embodiment of an electrically conductive member 24' is depicted, and shown in more detail in FIG. 4. In this design, a constant pitch, or distance between centers of conductive leads 26' having notches 32' is maintained as opposed to the variable pitch depicted in FIG. 1. The purpose of a variable pitch design is to allow for more spacing between leads on one of the circuitized substrates than the other. The square ring shape of members 24 and 24' are obviously not unique or necessary to the invention as many other designs, such as round, oval, rectangle, or non-ringed curved or straight sections are possible with various embodiments of the invention. In order to facilitate a more convenient and controlled mode of pulling off the retention members 30' and 34', notches 32" may be included in one or more regions of the retention members 30 and 34.

In FIG. 5, a partial side, sectional view of an electronic package 10 in accordance with one embodiment of the invention is depicted. The package 10 is shown after forming electrical bonds 28 and 28' but before removal of retention members 30 and 34. Thermocompression bonding heads 38, 39, 40, and 41 are depicted in phantom, retracted from contacting the package. Thermocompression bonding is known in the art and involves the use of rigid, preheated metal heads with smooth planar surfaces to apply pressure (in the range of about ten to fifty grams/bond for a lead 0.002 inch wide) and temperature for a time (1–5 sec) sufficient to surface weld and form metallurgical bonds between one metal surface (typically the aforementioned nickel-gold plated copper) and another metal surface (typically a small quantity of aluminum known as a "bump"). The electrically conductive member 24 may include small metallic "bumps" (gold or aluminum deposits, approximately 0.0005 inch radius half-spheres before bonding compression) at desired bonding locations to enhance the formation of strong metallurgical bonds and create electrical bonds 28. However, "bumps" may already be present on first or second circuitized member, or may not be required at all depending on the materials and surface finish of the circuitized member. Chips typically have small aluminum bumps for thermocompression bonding to a nickel-gold plated copper member such as member 24. Typical preheat temperatures for the bonding head 40 are 400–600° C., and 100–250° C. for bonding head 38; the actual values used are highly dependent on the devices being bonded and the metallurgical contents thereof. In the arrangement depicted in FIG. 5, chip 14 would be placed and positioned onto bonding head 40. Conductive member 24 would then be positioned appropriately, and bonding head 38 would apply pressure to form electrical bonds 28. Following that, the assembly including chip 14 bonded to member 24 would be placed onto preheated bonding head 41, circuitized substrate 12 (e.g., a flexible circuit having a lower dielectric layer with a pattern of conductors 16 on a top surface thereof) would be positioned, and bonding head 39 would apply pressure to form electrical bonds 28'. Many hundreds of bonds are thereby simultaneously formed in each bonding operation. The use of two pairs of bonding heads 38 and 40, and 39 and 41 obviously allows separate temperature, pressure, and time settings to accomplish the bonding in an optimal manner for each junction. However, it may not be necessary to use two separate bonding operations if the material choice of the conductive member 24 is compatible for bonding with both circuitized member at a common setting of bonding parameters. An example would be the use of aluminum material for member 24 bonded to gold plating on surfaces 22 and 16.

In FIG. 6, the two-step bonding operation just described utilizing two pairs of bonding heads 38 and 40, and 39 and 41 can be seen to be reduced to a one-step bonding operation utilizing one pair of bonding heads 42 and 43. All of the electrical connections are thereby formed nearly simultaneously. Following the bonding operation (once the electrical bonds have formed), the material separation occurs near notches 32. The package 10 is shown in FIG. 7 after removal of the retention members from member 24". The material separation occurring in the region of the notches 32 is depicted by showing the remaining portion of the notches as 32'". This embodiment depicts the first circuitized member 12 having a first surface 20 and the second circuitized member 14 having a first surface 22 in a facing relationship, with the conductive member 24" located below the second circuitized member 14. In FIG. 8, another embodiment depicts the conductive member 24''' located above the first surface 22' of second circuitized member 14'having electrical conductors 18'. The simultaneous forming of bonds 28'' and 28''' by the use of the one step bonding method previously described, with subsequent removal of the retention members from conductive member 24''', allows for a very low-profile, high performance electronic package 10' to be rapidly produced with good manufacturing yields.

While there have been shown and described what are at present considered the preferred embodiments of the invention, it will be obvious to those skilled in the art that various changes and modifications may be made therein without departing from the scope of the invention as defined by the appended claims.

What is claimed is:

1. A method of making an electronic package including first and second circuitized members each having a plurality of electrical conductors thereon, said method comprising:

positioning a first circuitized member having a first plurality of electrical conductors located on a first surface thereof;

positioning a second circuitized member having a second plurality of electrical conductors located on a first surface thereof;

positioning an electrically conductive member including a plurality of conductive leads as part thereof relative to said first and second circuitized members such that selected ones of said conductive leads are aligned with respective pairs of said first and second pluralities of electrical conductors of said first and second circuitized members;

providing a first retention member secured to said electrically conductive member for retaining said selected ones of said conductive leads in alignment relative to one another during said bonding;

providing notches in selected portions of said electrically conductive member prior to said positioning of said electrically conductive member; and substantially simultaneously electrically bonding said selected ones of said conductive leads to said respective pairs of said electrical conductors.

2. The method of claim 1 including the step of positioning said pluralities of electrical conductors of said first and second circuitized members in a facing relationship.

3. The method of claim 2 including the step of positioning said electrical conductors such that said first circuitized member is located above said second circuitized member.

4. The method of claim 2 including the step of substantially simultaneously electrically bonding from opposite directions said selected ones of said conductive leads to said respective pairs of said electrical conductors.

5. The method of claim 4 wherein said step of substantially simultaneously electrically bonding includes thermocompression bonding.

6. The method of claim 1 wherein said step of substantially simultaneously electrically bonding includes thermocompression bonding.

7. The method of claim 1 including the step of removing said first retention member after said bonding, said removal including material separation occurring substantially at said notches.

8. The method of claim 1 further including providing a second retention member at a spaced location on said electrically conductive member, said second retention member retaining said selected ones of said conductive leads in alignment relative to one another during said bonding.

9. The method of claim 8 including the step of removing said second retention member, said removal including material separation occurring after said bonding substantially at said notches.

10. A method of making an electronic package including first and second circuitized members each having a plurality of electrical conductors thereon, said method comprising:

forming an electrically conductive member including a plurality of conductive leads as part thereof with selected ones of said plurality of conductive leads secured to spaced apart first and second electrically conductive retention members, said first and second electrically conductive retention members retaining selected ones of said plurality of conductive leads in alignment relative to one another;

positioning a first circuitized member having a first plurality of electrical conductors located on a first surface thereof;

positioning a second circuitized member having a second plurality of electrical conductors located on a first surface thereof;

positioning said electrically conductive member relative to said first and second circuitized members such that selected ones of said conductive leads are aligned with respective pairs of said first and second pluralities of electrical conductors of said first and second circuitized members;

electrically bonding a first group of said selected ones of said plurality of conductive leads to selected ones of said first plurality of electrical conductors of said first circuitized member;

electrically bonding a second group of said selected ones of said second plurality of conductive leads to selected ones of said plurality of electrical conductors of said second circuitized member; and removing said first and second retention members.

11. The method of claim 10 including the step of positioning said electrical conductors of said first and second circuitized members in a facing relationship.

12. The method of claim 11 including the step of positioning said electrical conductors such that said first circuitized member is located above said second circuitized member.

13. The method of claim 11 including the step of electrically bonding said second group of selected ones of said plurality of conductive leads in an opposite direction from said electrical bonding of first group of selected ones of said plurality of conductive leads.

14. The method of claim 13 wherein said step of electrically bonding includes thermocompression bonding.

15. The method of claim 10 wherein said step of electrically bonding includes thermocompression bonding.

16. The method of claim 10 including providing notches in selected portions of said conductive leads of said electrically conductive member prior to said positioning of said conductive member.

17. The method of claim 16 wherein said step of removing said first retention member comprises separation of said retention member substantially at the location of said notches in said selected portions of said conductive leads.

18. The method of claim 16 wherein said step of removing said second retention member comprises separation of said retention member substantially at the location of said notches in said selected portions of said conductive leads.

* * * * *